United States Patent [19]
Yau et al.

[11] Patent Number: 5,570,374
[45] Date of Patent: Oct. 29, 1996

[54] BUILT-IN SELF-TEST CONTROL NETWORK

[75] Inventors: Chi W. Yau, Holland, Pa.; Yervant Zorian, Princeton, N.J.

[73] Assignee: Lucent Technologies Inc., Murray Hill, N.J.

[21] Appl. No.: 80,148

[22] Filed: Jun. 23, 1993

Related U.S. Application Data

[63] Continuation of Ser. No. 876,169, Apr. 30, 1992, abandoned.

[51] Int. Cl.$^6$ .................................................. G01R 31/28
[52] U.S. Cl. ...................... 371/22.5; 371/22.3; 371/22.4
[58] Field of Search ............................... 371/22.5, 22.4, 371/22.1, 21.3, 21.5, 22.3, 22.6

[56] References Cited

U.S. PATENT DOCUMENTS

| | | | |
|---|---|---|---|
| 4,498,172 | 2/1985 | Bhavsar | 371/25 |
| 4,503,537 | 3/1985 | McAnney | 371/25 |
| 4,730,316 | 3/1988 | Desyllas et al. | 371/25 |
| 4,872,168 | 10/1989 | Aadsen et al. | 371/21.3 |
| 5,006,787 | 4/1991 | Katireioglu et al. | 371/22.5 |
| 5,109,382 | 4/1992 | Fukumaka | 371/22.5 |
| 5,138,619 | 8/1992 | Fasang et al. | 371/22.5 |
| 5,175,494 | 12/1992 | Yoshimori | 371/22.3 |
| 5,189,675 | 2/1993 | Nozuyama et al. | 371/22.3 |
| 5,488,615 | 1/1996 | Kunoff et al. | 371/22.4 |

Primary Examiner—Robert W. Beausoliel, Jr.
Assistant Examiner—Trinh L. Tu

[57] ABSTRACT

Control of the self-testing of a plurality of elements ($12_1$–$12_m$), each having a Built-In, Self-Test (BIST) capability, and arranged in one or more groups ($14_1$–$14_n$), is carried out by a network (16) of one or more standard BIST resource interface controllers (SBRICs $18_1$–$18_n$). Each SBRIC in the network controls the self-testing of the elements in a separate one of the groups in sequence by broadcasting a test command to the elements in parallel which, in response, generate test signatures stored by the SBRIC. The SBRICs in the network are coupled in series in daisy chain fashion to enable the test signatures stored by the SBRICs to be concatenated for easy retrieval by shifting out the test signatures therefrom, using a technique such as boundary scan.

5 Claims, 2 Drawing Sheets

BUILT-IN SELF-TEST CONTROL NETWORK

This application is a continuation of application Ser. No. 07/876,169, filed on Apr. 30, 1992, now abandoned.

TECHNICAL FIELD

This invention relates to a network, and its method of operation, for controlling the testing of two or more self-testing elements within a digital circuit.

BACKGROUND OF THE INVENTION

Modern digital circuits now incorporate ever larger arrays of circuit elements (RAMs, ROMs CAMs, FIFOs and Random Logic blocks, for example) as designers strive to provide increased circuit functionality. The increasing density of modern digital circuits has greatly increased the difficulty of testing such circuits with conventional external testing machines designed for this purpose. Consequently, much effort has been devoted to designing individual circuit elements with an ability to test themselves, that is, provide the elements with a Built-in Self-Test (BIST) capability. Examples of circuit elements having BIST capability are found in U.S. Pat. No. 4,872,168, issued on Oct. 3, 1989, and U.S. Pat. No. 5,091,908, issued on Feb. 25, 1992, both assigned to AT&T Bell Laboratories, the present assignee.

The presence of individual circuit elements having BIST capability within a Very Large Scale Integrated (VLSI) circuit has not, however, eliminated the difficulty of testing. The testing of a VLSI circuit incorporating a variety of BIST'd elements, that is, elements having BIST capability, requires that an interface be provided within the circuit to couple a control signal from a test controller to each BIST'd element to initiate self-testing. In addition, the interface also must serve to latch a test signature generated by each BIST'd element at the completion of testing to allow subsequent transfer of the signature to the test controller.

One approach to providing such an interface for BIST'd RAM elements is described in the paper "ASIC Implementation of Boundary-Scan and BIST" by H. N. Scholz et al., published in the *Proceedings of the 8th International Custom Microelectronics Conference* (London, United Kingdom) 1989, pp. 43.1–43.9. In this paper, Scholz et al. describe a Built-In Self-Test (BIST) Resource Interface Controller (BRIC), typically a finite-state machine, for initiating self-testing of an individual BIST'd RAM in response to a start signal from a test controller. At the completion of testing, the RAM generates a test signature, indicative of the test result, which is stored (i.e., latched) in the BRIC.

The disadvantage of this approach is that a separate BRIC is required for each BIST'd RAM. Thus, scheduling of self-testing of each BIST'd RAM by its corresponding BRIC, as well as collection of the test signature from the corresponding BRIC must be coordinated by a test controller. As a result, the test controller must possess a high degree of sophistication to carry out such tasks, thus increasing its complexity and cost.

Thus, there is a need for a built-in self-test control network for scheduling the self-testing of a plurality of different types of BIST'd elements, and for latching the collective test signatures of the elements so as to reduce the complexity of the test controller.

SUMMARY OF THE INVENTION

Briefly, in accordance with a preferred embodiment of the invention, there is provided a built-in self-test network for a digital circuit, including at least two BIST'd elements, each comprising a module such as a RAM, ROM, FIFO, CAM and/or random logic element. The control network comprises at least one Standard Built-in self-test Resource Interface Controller (SBRIC) which supplies a test command signal to each BIST'd element to initiate self-testing thereof. The SBRIC, which typically comprises a finite-state machine, further includes at least one test register for storing a test signature, and at least one logic gate for logically combining test signatures from the BIST'd elements to enable them to be simultaneously self-tested in parallel.

In accordance with another aspect of the invention, a built-in self-test control network is provided for a digital circuit containing a large number of BIST'd elements. The control network includes a plurality of SBRICs serially coupled in a daisy chain. The first SBRIC in the chain serves to initiate self-testing of a first group or stage of BIST'd elements which are coupled to the SBRIC in parallel. Each successive SBRIC in the chain is responsive to a control signal generated by a previous SBRIC in the chain and serves to initiate self-testing of the BIST'd elements in the corresponding successive stage associated with that SBRIC so that the stages of elements are tested in sequence. Each SBRIC includes a least one test register for storing the collective test signature of the BIST'd elements in the associated stage associated with that SBRIC. By virtue of the SBRICs being serially coupled in a daisy chain, the test signature of each stage latched into a corresponding SBRIC is advantageously concatenated with the test signatures held by the other SBRICs. Thus, the resultant string of test signatures held by the chain of SBRICs can be advantageously shifted out using a technique such as boundary scan.

DETAILED DESCRIPTION

Figure 1:
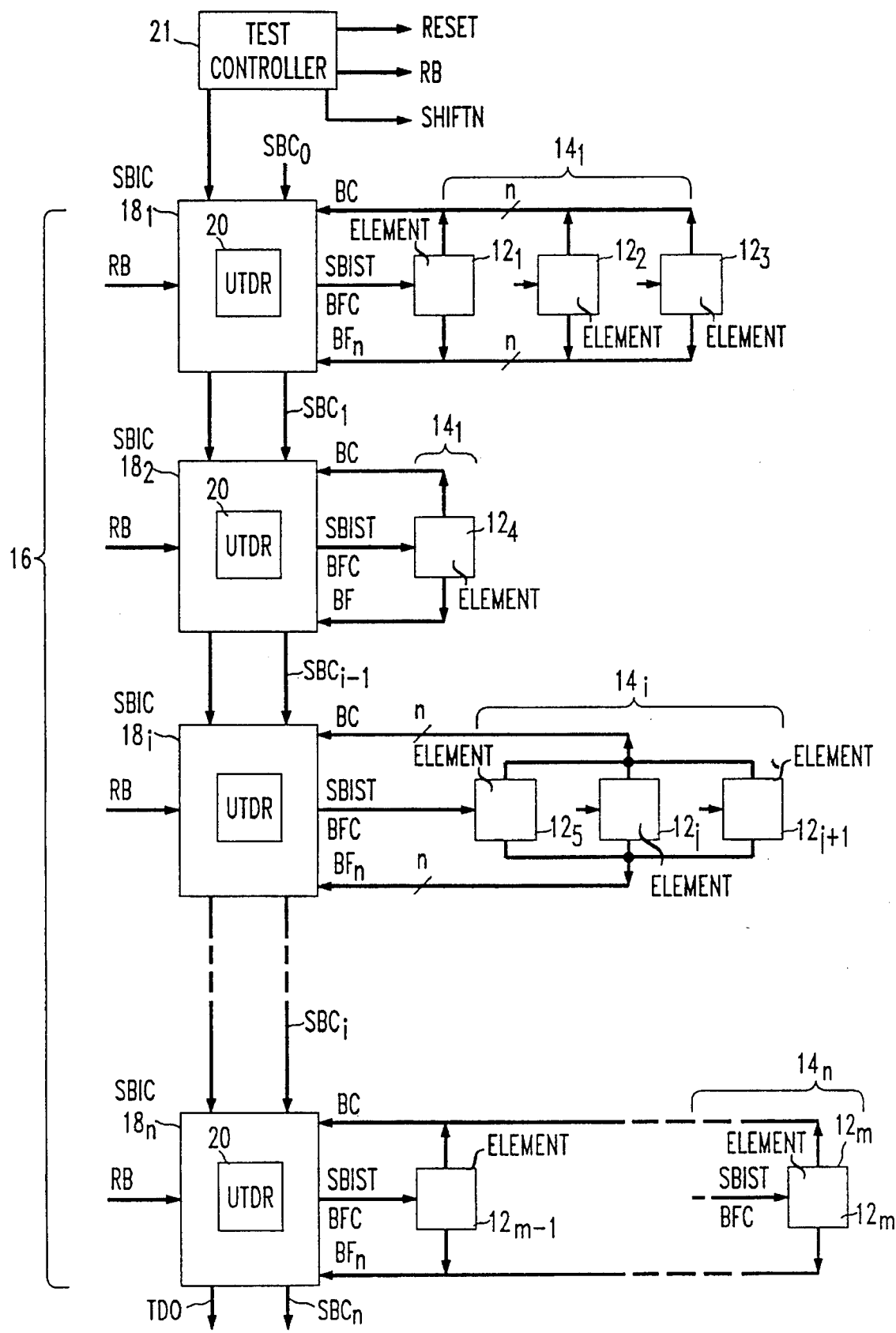
FIG. 1 is a block schematic diagram of a portion of a digital circuit incorporating a built-in self-test network in accordance with the present invention.

FIG. 1 is a block schematic diagram of a digital circuit 10 comprised of a plurality of individual circuit elements $12_1$, $12_2, 12_3 \ldots 12_m$ where m is an integer $\geq$ two. The elements $12_1$–$12_m$ are arranged in groups or stages $14_1, 14_2, 14_3 \ldots 14_n$ of two or more elements each where n is an integer $\leq$ m. Each of the elements $12_1$–$12_m$ takes the form of a digital logic element, such as, for example, a RAM, ROM, CAM, FIFO or Random Logic Element, which has a built-in, self-test capability. In other words, each of the elements $12_1$–$12_m$ is BIST'd. The number and type of elements $12_1$–$12_m$ present in the circuit 10 is dependent on its function, and it should be understood that the circuit could include a larger or smaller number of elements, arranged the same or differently from those shown in FIG. 1. Additionally, the circuit 10 may also include other types of elements (not shown) which are not BIST'd.

Generally, self-testing of each of the BIST'd elements $12_1$–$12_m$ is carried out by applying a start BIST signal, hereinafter referred to as an SBIST signal, to each element. In response to the SBIST signal, each of the BIST'd elements $12_1$–$12_m$ executes a self-testing routine in accordance with its particular structure. The results of the self-testing undertaken by each of the elements $12_1$–$12_m$ are reflected in the status of a flag (not shown), referred to as a BIST flag, within each element. Typically, the BIST flag within each of the elements $12_1$–$12_m$, which is usually one bit wide, is set to zero for a "pass" condition (i.e., a successful self-test) while the flag is set to a binary one for a "fail" condition (i.e., an unsuccessful test). The status of the BIST flag serves as a "test signature" for that element. Once the BIST flag is set, each element generates a BIST complete signal, hereinafter referred to as the BC signal, indicating that the element has completed its BIST routine.

Even though the BIST'd elements $12_1$–$12_m$ appear to have each undergone successful self-testing, one or more elements may be defective because its BIST flag is stuck at a binary zero (i.e., the BIST flag erroneously indicates a successful test). To avoid a "false positive" test result, each of the elements $12_1$–$12_m$ is supplied with a BIST flag check signal, referred to as a BFC signal, at the completion of testing. The BFC signal serves to toggle the BIST flag within each element. If the BIST flag toggles (i.e., changes state) in response to the BFC signal, then the test result, reflected by the state of the BIST flag within the element, is indeed accurate.

In accordance with the invention, control of the BIST function of the BIST'd elements $12_1$–$12_m$ within the circuit 10 is accomplished by a BIST control network 16. The network 16 is comprised of at least one, and preferably, a plurality of, Standard BIST Resource Interface Controllers (SBRICs) $18_1$, $18_2$, $18_3$ ... $18_n$, each SBRIC controlling the BIST'd elements in a corresponding one of the stages $14_1$–$14_n$, respectively. As will be discussed in greater detail below with respect to FIGS. 2 and 3, each of the SBRICs $18_1$–$18_n$ typically comprises a five-state, finite-state machine which initiates testing of those of the elements $18_1$–$18_n$ in a corresponding stage by broadcasting an SBIST signal to the elements in that stage. Further, at the completion of testing, each of the SBRICs $18_1$–$18_n$ broadcasts a BFC signal to the elements in its corresponding stage to toggle the BIST flag in each element to check if the flag is stuck at a zero.

Each of the SBRICs $18_1$–$18_n$, in addition to supplying both the SBIST and BFC signals, also serves to store the test signature of the elements in its corresponding stage. The test signature is stored in each SBRIC within a User Data Test Register (UTDR) 20, which, as will be described, typically takes the form of one or more flip-flops. The UTDR 20 in each of the SBRICs $18_1$–$18_n$ is serially coupled with those of the other SBRICs in the network 16. In this way, the test signatures held by the SBRICs $18_1$–$18_n$ are concatenated and may be shifted out from the network 16 by a technique such as boundary scan. For example, in the network 16, the SBRICs $18_1$–$18_n$ are coupled so that the UTDR 20 of the first SBRIC $18_1$ has its input coupled to a Test Data Output (TDO) of a boundary scan test controller 21 and the last SBRIC $18_n$ has the output of its UTDR coupled to a Test Data Input (TDI) of the controller. In this way, the concatenated test signature held by the SBRICs $18_1$–$18_n$ can be shifted out to the boundary scan test controller by shifting a string of kn bits through the network 16 of SBRICs, where $k \geq 1$ and corresponds to the number of flip-flops per SBRIC (not shown).

Figure 2:
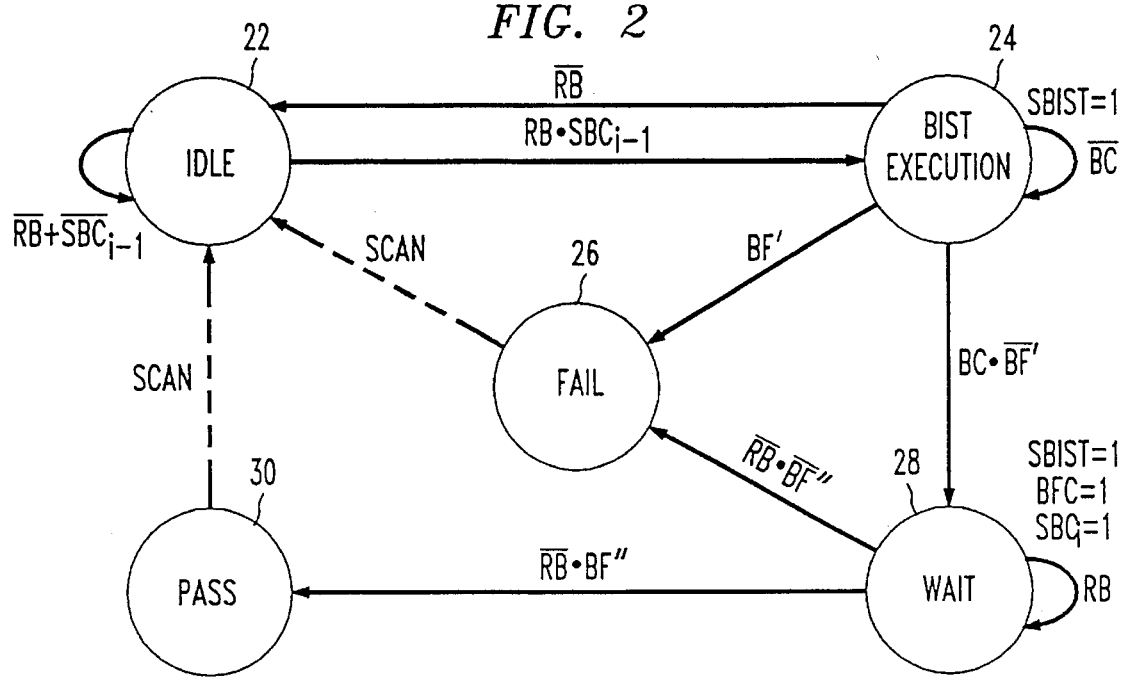
FIG. 2 is a state diagram of a Standard, Built-in self-test Resource Interface Controller (SBRIC) comprising part of the network of FIG. 1.

As described earlier, each of the SBRICs $18_1$–$18_n$, as generically represented by the SBRIC $18_i$ where i=1,2,3 . . . n, comprises a five-state, finite-state machine, the state diagram of which is shown on FIG. 2. As depicted in FIG. 2, the five states of the SBRIC $18_i$ comprise an IDLE state 22, a BIST execution state 24, a FAIL state 26, a WAIT state 28, and a PASS state 30. At the outset of operation, the SBRIC $18_i$ enters the IDLE state 22 of FIG. 2 during which time the SBRIC is dormant. The SBRIC $18_i$ remains in the IDLE state 22 for as long as either of two signals, Run BIST, hereinafter referred to as RB, and SBRIC $18_{i-1}$ complete, hereinafter referred to as $SBC_{i-1}$, is at a binary zero value. The signal RB is generated by the test controller 21 of FIG. 1 and is broadcast to the SBRIC $18_i$. By raising the logic state of the signal RB from a binary zero to a binary one, the test controller 21 signals the SBRIC $18_i$ to initiate self-testing of the elements $12_1$–$12_m$ in its corresponding stage $14_i$.

Figure 3:
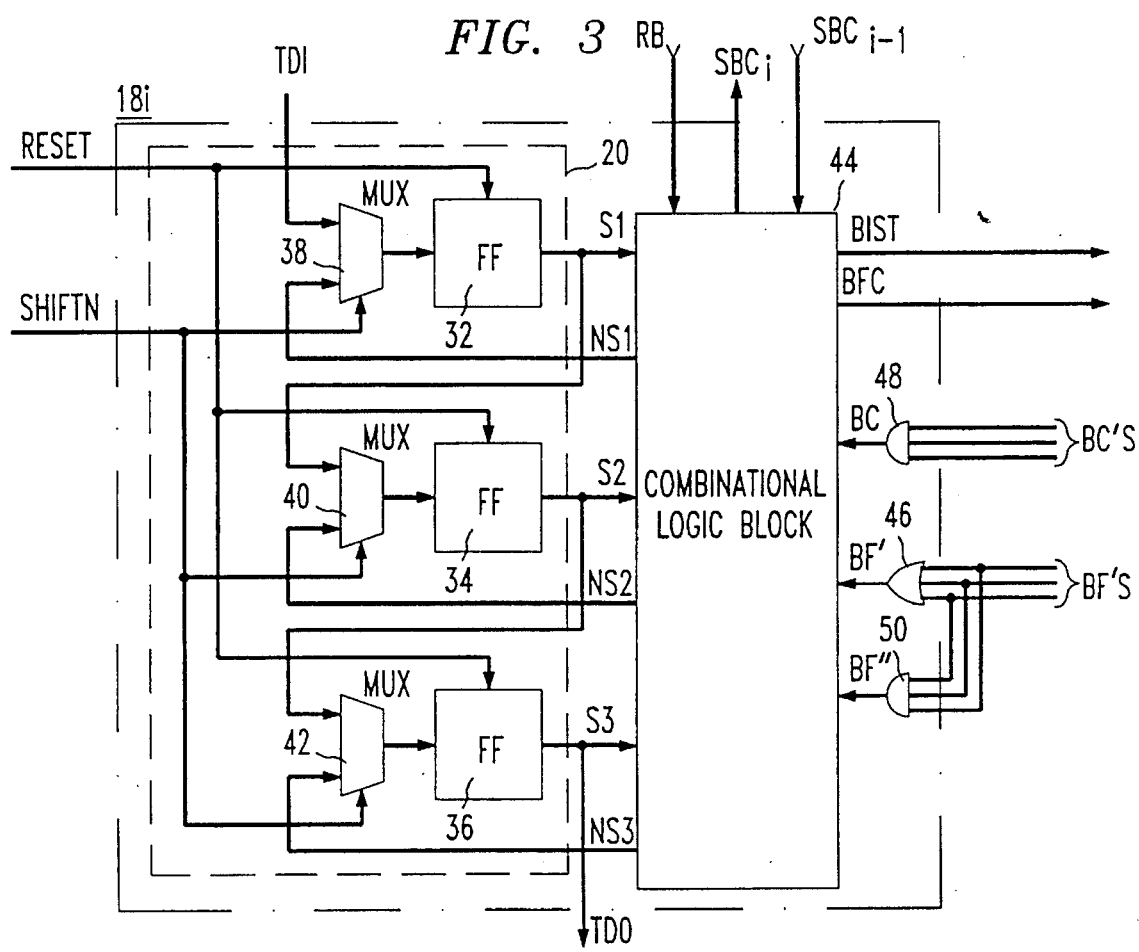
FIG. 3 is a block schematic diagram of the SBRIC of FIG. 2.

As will become better understood by FIG. 3, the signal $SBC_{i-1}$, which is generated by the SBRIC $18_{i-1}$, changes to a binary one level at the completion of built-in self-testing of the elements in the stage $14_{i-1}$. By the same token, the SBRIC $18_i$ will generate a binary one level signal $SBC_i$ when it has completed built-in self-testing of the elements in its corresponding stage $14_i$. In this way, each succeeding one of the SBRICs $18_1$–$18_n$ in the network 16 of FIG. 1 is actuated in sequence by the previous SBRIC to initiate self-testing of its corresponding stage so that the elements in the stages $14_1$–$14_n$ are self-tested in sequence.

When both the RB and $SBC_{i-1}$ signals reach a binary one level, then the SBRIC $18_i$ enters the BIST execution state 24 and generates a binary one level SBIST signal which is broadcast to those of the elements $12_1$–$12_m$ within the stage $14_i$. Normally, the SBRIC $18_i$ remains in the BIST execution state 24 until such time as the elements within the stage $14_i$ have each generated a binary one level BC signal to indicate that the element has completed self-testing. However, should any of the elements in the stage $14_i$ generate a binary one level BF' signal (i.e., a signal obtained by logically OR'ing the individual BF signals) during the time the SBRIC is in the BIST execution state 24, then the Fail state 26 is entered.

There is an important reason for entering the Fail state 26 immediately upon receipt of a binary one level BF signal from any element in the stage $14_i$, rather than waiting until the completion of testing of all of the elements in the stage. In practice, the elements $12_1$–$12_m$ are clocked at a much higher frequency than the SBRICs $18_1$–$18_m$. Thus, an element within the stage $14_i$ may complete its BIST routine, then generate a binary one level BF to indicate a fault, and thereafter reset its BIST flag so as to now generate a binary zero BF signal, all well before the SBRIC $18_i$ has been notified that the other elements in the stage have each completed their self-testing routines. Were the SBRIC $18_i$ to read the BIST flag of the element $12_j$ after it had been reset, the state of the BIST flag would reflect a pass condition when, in fact, the element had actually failed.

The SBRIC $18_i$ enters the Wait state 28 from the BIST execution state 24 when each of the BC signals from the elements in the stage $14_i$ is at a binary one level and each BF signal is at a binary zero level (i.e., BF'=0). During the Wait state 28, the SBRIC $18_i$ generates a binary one level BFC signal to toggle the BIST flag elements within the corresponding stage $14_i$ to check for a stuck-at-zero condition. While in the Wait state 28, the SBRIC $18_i$ also generates a binary one level $SBC_i$ signal to notify the next successive SBRIC $18_{i+1}$ in the network 16 of FIG. 1 to initiate self-testing of the elements in its corresponding stage $14_{i+1}$.

The SBRIC $18_i$ remains in its Wait state 28 for so long as the RB signal supplied by the test controller 21 of FIG. 1 remains at a binary one level. In other words, once the SBRIC $18_i$ has initiated built-in self-testing of the elements in its corresponding stage $14_i$ and has actuated the next SBRIC $18_{i+1}$ in the network 16, the SBRIC $18_i$ waits for the RB signal to become a binary zero, which occurs once all of the SBRICs have been sequenced. The SBRIC $18_i$ leaves the Wait state 28 and either enters the Fail state 26, as mentioned earlier, or the Pass state 30, depending on the status of each of the BF signals from the elements in the stage $14_i$.

If the RB signal is zero and one or more of the BF signals is at a binary zero level, that is, BF'=0 (indicating a stuck-at-zero condition of one or more of the elements in the stage), then the Fail state 26 is entered. Conversely, if the RB signal is a binary zero, but all of the BF signals from the elements in the stage $14_i$ are a binary one (indicating a successful test and BIST flag check), then the Pass state 30 is entered. Once the SBRIC $18_i$ enters either the Fail state 26 or the Pass state 30, the SBRIC remains in that state until a reset signal (from the test controller 21 of FIG. 1) is asserted, or until the contents of the UTDR 20 are scanned out, and the values corresponding to the Idle state 22 are scanned in. Thereafter, the SBRIC $18_i$ returns to the Idle state 22. The Idle state 22 is also entered from the BIST execution state 24 when RB goes to zero. Further, the Idle state 22 is entered from any other state when a logic one-level RESET signal is applied.

Referring now to FIG. 3, there is shown a block schematic diagram of the SBRIC $18_i$ (the SBRICs being identically configured to each other). The SBRIC $18_i$ comprises three separate flip-flops 32, 34 and 36, respectively, which collectively comprise UTDR 20 of FIG. 2. Each of the flip-flops 32, 34, and 36 has its input supplied with output of a separate one of a set of multiplexers 38, 40 and 42, respectively, each multiplexer being controlled by a signal SHIFTN generated by the test controller 21 of FIG. 1. The first input of the multiplexer 38 is supplied with a test signal from the TDO test controller 21 of FIG. 1 while the first input of each of the multiplexers 40 and 42 is supplied with the output signal of a separate one of the flip-flops 32 and 34, respectively. The output signal of the flip-flop 36 is coupled to the TDI of the test controller 21.

The flip-flops 32, 34, and 36 each generate a separate one of a set of output signals S0, S1 and S2, respectively, referred as state signals, which are supplied to a combinational logic block 44. The logic block 44 is also supplied with the RB signal from the test controller 21 of FIG. 1 and the signal $SBC_{i-1}$ from the SBRIC $18_{i-1}$ (not shown). Additionally, the logic block 44 is supplied with the output of an OR gate 46 and the output of each of a pair of AND gates 48 and 50. The OR and AND gates 46 and 48 serve to logically OR and AND the BF and BC signals, respectively, generated by the elements (not shown) in the corresponding stage $14_i$ (not shown) controlled by the SBRIC $18_i$. The AND gate 50 serves to logically AND all the BF signals to determine whether all the BIST flags change state during the BIST flag check. For ease of reference the output signals of the OR gate 46 and the AND gates 48 and 50 are designated by the terms BF', BC' and BF", respectively.

The combinational logic block 44 is typically comprised of a network of individual gates (not shown) which is supplied at its inputs with the signals S0, S1, S2, RB, $SBC_{i-1}$ and the output signals of the gates 46, 48 and 50. In response to the signals at its inputs, the combinational logic block 44 generates the signals SBIST and BFC. Also, the block generates a set of signals NS0, NS1, and NS2 which are each supplied to the second input of a corresponding one of the multiplexers 32, 34 and 36. During self-testing, the SHFTN signal is held at a binary zero so that the multiplexers 32, 34 and 36 pass a separate one of the signals NS0, NS1 and NS2 to a respective one of the flip-flops 32, 34 and 36, respectively.

To better understand the relationship between the input signals supplied to the combinational logic block 44, and the output signals generated thereby, reference should be had to Table I below which contains two separate sets of entries divided by a vertical double line.

TABLE I

| Current State | RB | $SBC_{i-1}$ | BF' | BC' | BF" | Next State | SBIST | BFC | $SBC_i$ |
|---|---|---|---|---|---|---|---|---|---|
| Idle 22(1) | 0 | X | X | X | X | Idle 22 | 0 | 0 | 0 |
| Idle 22(2) | X | 0 | X | X | X | Idle 22 | 0 | 0 | 0 |
| Idle 22(3) | 1 | 1 | X | X | X | BIST Ex. 24 | 0 | 0 | 0 |
| BIST Ex. 24(1) | 0 | X | X | X | X | Idle 22 | 0 | 0 | 0 |
| BIST Ex. 24(2) | 1 | X | X | 0 | X | BIST Ex. 24 | 1 | 0 | 0 |
| BIST Ex. 24(3) | 1 | X | 0 | 1 | X | Wait 28 | 1 | 0 | 0 |
| BIST Ex. 24(4) | 1 | X | 1 | X | X | Fail 26(1) | 1 | 0 | 0 |
| Wait 28(1) | 1 | X | X | X | X | Wait 28 | 1 | 1 | 1 |
| Wait 28(2) | 0 | X | X | X | 0 | Fail 26(2) | 1 | 1 | 1 |
| Wait 28(3) | 0 | X | X | X | 1 | Pass 30 | 1 | 1 | 1 |
| Fail 26(1) | X | X | X | X | X | Fail 26(4) | 1 | 1 | 1 |
| Pass 30(1) | X | X | X | X | X | Pass 30 | 1 | 1 | 1 |

The left-hand set of entries in Table I indicates the relationship between each of the five presently active states of the SBRIC $18_i$ (Idle, BIST execution, Wait, Fail and Pass) and the status of each of the input signals RB, $SBC_{i-1}$, BF', BC' and BF" to the logic block 44 during each state.

For each current state of the SBRIC $18_i$, represented by an entry in the left-hand side of Table I, there is a corresponding entry in the right-hand side of the table. Each entry in the right-hand side of the table represents the next state of the SBRIC that immediately follows the current state (the left-hand entry), and the state of the output signals, BIST, BFC and $SBC_i$ for that next state.

As an example, at the outset of self-testing, the RB signal from the test controller is a binary zero, so that the SBRIC $18_i$ is in the Idle state 22(1), as indicated by the first entry in the left-hand part of Table I. The status of the $SBC_{i-1}$ signal, and the signals BF', BC' and BF", from the OR gate 46 and the AND gates 48 and 50, respectively, are not of concern and therefore are depicted in the left-hand portion of Table I as don't-care (x) values. From the Idle state 22 (1), the next state of the SBRIC $18_i$ immediately following it is the Idle state 22 (1), at which time, the signals SBIST, BFC and $SBC_i$ produced by the combinational logic block 44 are each a binary zero. This state of affairs is consistent with that described in FIG. 2 since the SBRIC $18_i$ remains in the Idle state (22) for as long as either of the RB and $SBC_{i-1}$ signals is a binary.

Now consider when the SBRIC $18_i$ is currently in the BIST execution state 24 (4) while the input signals RB and BF' are each a binary one and the BC, $SBC_i$ and BF" signals are at don't-care values. From the BIST execution state 24 (4), the next state entered by the SBRIC $18_i$ is the Fail state 26 (1) at which time the SBIST signal is at a binary one, while BFC and $SBC_i$ signals are each maintained at a binary zero. This state of affairs is consistent with that depicted in FIG. 2 since the presence of a binary one level BF' signal indicates a failure in the testing of one or more of the elements in the stage $14_i$.

At the completion of self-testing (i.e., while the SBRIC $18_i$ of FIG. 3 remains in the Idle state 22 of FIG. 2), the SHFTN signal changes to a binary one level. Once the SHFTN signal changes states, a stream of bits supplied at the TDI of the SBRIC $18_i$ from the test controller 21 of FIG. 1 can be shifted through the flip-flops 32, 34, and 36 of FIG. 3 to shift out the composite test signature of the elements in the stage $14_i$ which is held by these flip-flops.

When the RESET signal is asserted (RESET=1), the SBRIC $18_i$ will be forced to enter the IDLE state 22 unconditionally.

The foregoing describes a network 16, comprised of one or more standard BIST resource interface controllers $18_1$–$18_n$ for controlling the self-testing of a plurality of BIST'd elements $12_1$–$12_m$.

It is to be understood that the above-described embodiments are merely illustrative of the principles of the invention. Various modifications and changes may be made thereto by those skilled in the art which will embody the principles of the invention and fall within the spirit and scope thereof.

For example, each SBRIC $18_i$ in the illustrated embodiment has been configured to store a single composite test signature obtained by logically OR'ing the test signatures of the individual elements in the corresponding stage $14_i$. Rather than store a composite test signature, each SBRIC $18_i$ could easily be modified to store a multi-bit test signature, with each bit representing the individual test signature of a separate element in the stage.

We claim:

1. A network for controlling the self-testing of a plurality of electronic devices in parallel, each electronic device having Built-In, Self-Test (BIST) circuitry, said network comprising:

at least one Standard BIST Resource Controller (SBRIC) coupled to said plurality of electronic devices, each SBRIC generating a test command which is broadcast to the Built-in Self-Test circuitry of each of said electronic devices in parallel to cause each electronic device to initiate self-testing so each electronic device generates a test signature, each SBRIC storing the test signatures generated by said electronic devices following self-testing, each SBRIC including:

(a) a finite-state machine for broadcasting the test command to each of said electronic devices coupled to the SBRIC to initiate self-testing of said electronic devices and for storing a composite test signature indicative of the test signatures of said electronic devices coupled to that SBRIC; and (b) logic gate means coupled to said electronic devices and the finite-state machine for logically combining said test signatures of said electronic devices simultaneously to yield the composite test signature that allows identification of said each electronic device that fails supplied to said finite-state machine for storage; and wherein the network further includes a Boundary-Scan test controller for shifting a string of bits through each of said SBRICS to shift out the composite test signatures.

2. The network according to claim 1 further including a plurality of SBRICs serially coupled in a daisy chain, each SBRIC responsive to each preceding SBRIC in the chain for initiating self-testing of a group of the electronic devices so that the groups of electronic devices are self-tested in sequence.

3. The network according to claim 2 wherein the finite-state machine comprises:

first, second and third flip-flops coupled in daisy chain fashion such that the first and second flip-flops each have their output coupled to the input of a separate one of the second and third flip-flops, respectively, the first flip-flop receiving external signals, each of the first, second and third flip-flops generating separate first, second and third state signals, respectively, in accordance with said flip-flops respective input signal; and a logic block responsive to the first, second and third state signals from the first, second and third flip-flops, respectively, and responsive to a sequence signal generated by a preceding SBRIC in a chain of SBRICs for generating the test command signal supplied to an associated group of electronic devices, and in response to a composite test signature from said electronic devices, said logic block generating a sequence signal supplied to a subsequent SBRIC in the chain of SBRICs, and generating separate first, second and third next-state signals supplied to the input of a separate one of the first, second and third flip-flops, respectively.

4. A method for controlling self-testing of a plurality of electronic devices, each electronic device having Built-In Self-Test circuitry, comprising the steps of:

broadcasting a test command to the Built-In Self-Test circuitry of each of said electronic devices to initiate the self-testing of each electronic device so that said each electronic device generates a test signature;

logically combining said test signatures of said electronic devices simultaneously to yield a single composite test signature that allows identification of said each electronic device that fails;

storing said composite test signature of the electronic devices in a register; and shifting a string of values from a Boundary-Scan test controller through the register to shift out said composite test signature.

5. A method for controlling self-testing of a plurality of electronic devices arranged in groups, each electronic device in each group having Built-In Self-Test circuitry, comprising the steps of:

broadcasting a test command to each group of electronic devices in sequence to cause the Built-In Self-Test circuitry in each of said electronic devices to cause the electronic devices in the group to undergo self-testing so that each electronic device in the group generates a test signature;

logically combining said test signatures of said electronic devices in each group simultaneously to yield a single composite test signature that allows identification of said each electronic device that fails associated with that group;

storing said composite test signature of the electronic devices in each group in a register associated with said group following the self-testing;

generating a sequencing signal to initiate self-testing of a next group of electronic devices following receipt of said composite test signature from the group of electronic devices just tested; and shifting a string of values from a Boundary-Scan test controller through each storage register to shift out the composite test signature stored in said register.

* * * * *